United States Patent
Maglione et al.

(10) Patent No.: US 8,405,303 B2
(45) Date of Patent: Mar. 26, 2013

(54) ORGANIC ELECTROLUMINESCENT DEVICE WITH ISOLATION REGION FOR IMPROVED LIGHT EMISSION AND SYSTEMS INCLUDING SAME

(75) Inventors: Maria Grazia Maglione, Torre Del Greco (IT); Chiara Leo, Bari (IT); Salvatore Leonardi, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 979 days.

(21) Appl. No.: 11/582,137

(22) Filed: Oct. 16, 2006

(65) Prior Publication Data

US 2007/0096643 A1  May 3, 2007

(30) Foreign Application Priority Data

Oct. 14, 2005 (EP) ..................... 05425721

(51) Int. Cl.
*H01J 1/62* (2006.01)
*H01J 63/04* (2006.01)

(52) U.S. Cl. .......... 313/506; 313/505; 313/507; 445/24; 445/25

(58) Field of Classification Search .......... 313/495–512; 445/24–25
See application file for complete search history.

(56) References Cited

U.S. PATENT DOCUMENTS

| | | | |
|---|---|---|---|
| 6,057,647 A * | 5/2000 | Kurosawa et al. | 315/169.3 |
| 6,356,032 B1 | 3/2002 | Suzuki et al. | |
| 6,566,156 B1 * | 5/2003 | Sturm et al. | 438/35 |
| 2002/0145381 A1 | 10/2002 | Humbs | |
| 2003/0170493 A1 | 9/2003 | Chen et al. | |
| 2003/0209707 A1 * | 11/2003 | Tsuchiya | 257/40 |
| 2003/0227253 A1 * | 12/2003 | Seo et al. | 313/504 |
| 2004/0004214 A1 * | 1/2004 | Yamazaki et al. | 257/40 |
| 2004/0021413 A1 * | 2/2004 | Ito et al. | 313/504 |
| 2004/0051444 A1 * | 3/2004 | Schaepkens et al. | 313/504 |
| 2004/0183436 A1 * | 9/2004 | Ito et al. | 313/506 |
| 2005/0162061 A1 * | 7/2005 | Bae et al. | 313/483 |
| 2005/0170076 A1 * | 8/2005 | Seki et al. | 427/66 |
| 2006/0192487 A1 * | 8/2006 | Choi et al. | 313/512 |
| 2006/0250084 A1 * | 11/2006 | Cok et al. | 313/512 |

FOREIGN PATENT DOCUMENTS

| | | |
|---|---|---|
| DE | 10331109 A1 | 1/2005 |
| EP | 0862156 A | 9/1998 |
| JP | 06338393 A | 12/1994 |

OTHER PUBLICATIONS

European Patent Office, European Search Report, European Application No. EP 05 42 5721, Jun. 12, 2006, 3 pages.

* cited by examiner

*Primary Examiner* — Tracie Y Green
(74) *Attorney, Agent, or Firm* — Graybeal Jackson LLP

(57) ABSTRACT

An electroluminescent device includes at least first and second radiation emitter devices arranged on a common substrate. Each radiation emitter devise includes a first active layer and a second layer of organic material for generating the radiation, respectively. This device includes isolation means of dielectric material which are at least partially interposed between the first and second active layers to electrically isolate the first layer from the second active layer.

23 Claims, 5 Drawing Sheets

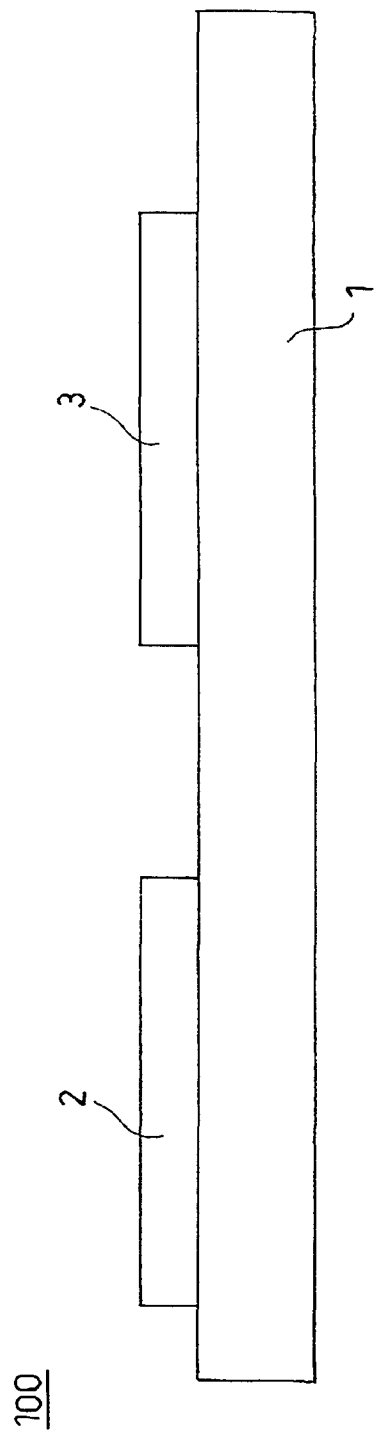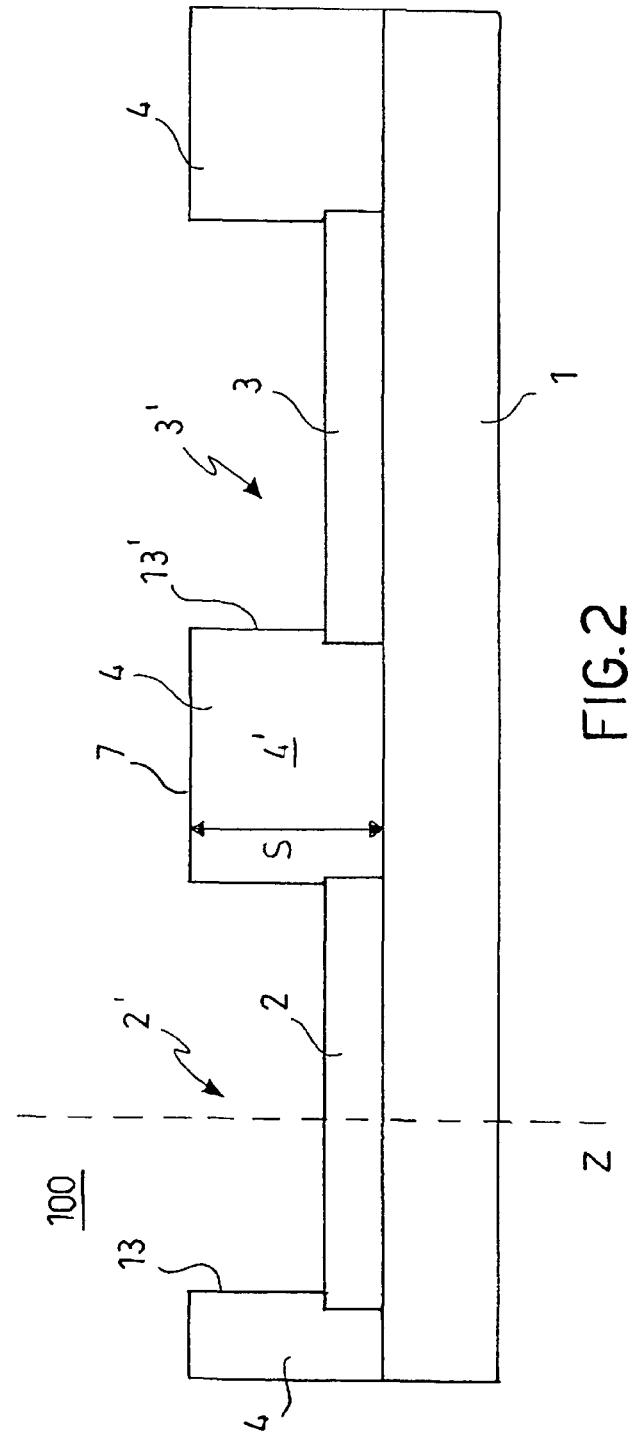

ORGANIC ELECTROLUMINESCENT DEVICE WITH ISOLATION REGION FOR IMPROVED LIGHT EMISSION AND SYSTEMS INCLUDING SAME

PRIORITY CLAIM

The present application claims the benefit of European Patent Application No. 05425721.7, filed Oct. 14, 2005, which application is incorporated herein by reference in its entirety.

TECHNICAL FIELD

Embodiments relate to an electroluminescent device, and more particularly, to an organic electroluminescent device.

BACKGROUND

Generally, an electroluminescent device (such as a display) comprises a plurality of devices emitting visible radiation, best known as pixels, which are arranged such as to form a matrix of light spots. Usually, for each of the emitting devices, the light emission occurs at a preset wavelength, corresponding to the wavelength of one of the three basic colors: red R, green G, and blue B ("RGB").

In an electroluminescent device, the individual pixels are grouped in macro-pixels comprising a first pixel for emitting the red light, a second pixel for the green light and a third pixel for the blue light. Thereby, each macro-pixel is capable of emitting light in any color as a combination of the three basic colors RGB.

Currently marketed displays are liquid crystal displays (LCD) or displays employing silicon emitter devices, i.e. junction diodes.

In recent years, a considerable research activity has been addressed to the development of electroluminescent devices manufactured using materials alternative to silicon, such as organic polymer materials.

In an electroluminescent device manufactured using organic polymer materials, each of the visible radiation emitter devices is a multilayer structure consisting of an anode and a cathode of a conductive material, one or more layers of organic polymer material being interposed therebetween. These devices are known as Organic Light Emitting Diodes (OLEDs). As conventionally established in this field, the anode is a hole injector electrode whereas the cathode is an electron injector electrode.

The external behavior of an OLED is similar to that of a visible radiation emitter device made of silicon (i.e. a p-n junction) in which the visible radiation is generated by applying a potential difference between anode and cathode. In fact, also in the case of an OLED, by polarizing the device, i.e. applying a potential difference between anode and cathode, mechanisms are generated within the layer of polymer material that cause the emission of light radiation.

Particularly, a first OLED is known in which the layer of polymer material comprises at least two different layers having the function of Hole Transport Layer (HTL) and Electron Transport Layer (ETL), respectively. Qualitatively, in this type of OLED, by polarizing the emitter device, holes are injected from the anode and electrons from the cathode that can reach the layers HTL and ETL, respectively, thereby forming electron-hole pairs (also known in the literature as the exciton). Each of these electron-hole pairs is in the so-called excited state, and as it is understood by those skilled in the art, it is subjected to a decay step to pass from the excited state to the ground state. It is during this quantum transition that the emission of light radiation is generated.

Furthermore, a second type of OLED is known in which the layer of polymer material is made by an individual layer having the double function of Hole Transport Layer (HTL) and Electron Transport Layer (ETL). The operating principle of this type of OLED is similar to those qualitatively described above with reference to the first typology.

The organic polymer materials used for the first type of OLEDs are low molecular weight polymer materials (clusters of a few molecules, oligomers) whereas those of the second type of OLEDs are high molecular weight polymer materials (clusters of many molecules, polymers).

The use of organic polymer materials highly influences the selection of the layer deposition techniques and the definition of the geometries to be employed in the process for manufacturing an electroluminescent device. In fact, the organic polymer materials (both of high molecular weight and low molecular weight) are very sensitive to those deposition techniques and definition that are normally used for layers of inorganic materials. In fact, the conventional photolithography techniques cannot be used on organic polymer materials since they are very delicate materials which are unlikely to withstand etching techniques. The evaporation deposition technique and definition through shadow mask is successfully used for defining precise geometries in the polymer materials.

The electroluminescent devices made of organic polymer materials of the known type have drawbacks resulting from electrical and optical losses causing the undesired effects of electric crosstalk and optical crosstalk, respectively, between OLEDS arranged proximate to each other.

In fact, it has been noted that, by using conventional deposition techniques (shadow mask evaporation) the polymer materials are diffused not only vertically but also laterally. This entails that two layers of organic material belonging to OLEDs, which are different but placed side by side, can be in contact with each other. Since the polymer materials are also electrical conductors, a spurious electric path is created in which part of a OLED control electric current is carried to an OLED that is adjacent thereto, thereby causing the same to be powered, by electric crosstalk, despite it is not polarized.

These types of losses cause a low luminosity of the electroluminescent device since part of the electric current intended for supplying an individual pixel is lost. Typically, this drawback is limited by supplying the device with a greater power, but this inevitably implies a greater supply power consumption than in the ideal operation.

The optical crosstalk is exhibited, for example, when an OLED adjacent to a powered one turns on. This is due to part of the light radiation emitted by the powered OLED that can be lost in a different direction from the main direction of radiation, such as side emissions. The photons of side emissions reach the adjacent OLED and cause the same to turn on, by photoluminescent effect.

Furthermore, side emissions can, in some ways, be channeled in spurious optical paths that are defined between those spaces separating the plurality of OLEDs in a display, thereby interference between the OLEDs because of optical crosstalk is more likely to occur.

When the pixels are partially turned on and others are undesirably turned on, or unwillingly turned off, the image definition is very poor.

To overcome the drawbacks set forth above, which have been found to be mainly due to a too close distance between adjacent pixels, attempts have been made to increase this distance but this entails a reduction in the electroluminescent device resolution.

There is a need for an electroluminescent device made of organic material which allows reducing the crosstalk, and particularly, restraining the electrical crosstalk between adjacent pixels.

SUMMARY

According to one embodiment, an electroluminescent device includes at least first and second radiation emitter devices arranged on a common substrate. Each radiation emitter device includes a first active layer and a second active layer of organic material for generating the radiation, respectively. Isolation means of dielectric material are at least partially interposed between the first and second active layers to electrically isolate the first layer from the second active layer.

BRIEF DESCRIPTION OF THE DRAWINGS

The disclosure will be better understood from the detailed description of embodiments set forth below, which are given as non-limiting examples, with reference to the annexed drawings, in which:

FIGS. 1 to 4 are longitudinal sectional views of an electroluminescent device according to an embodiment and in different intermediate steps of a fabrication process therefor;

DETAILED DESCRIPTION

Figure 3:
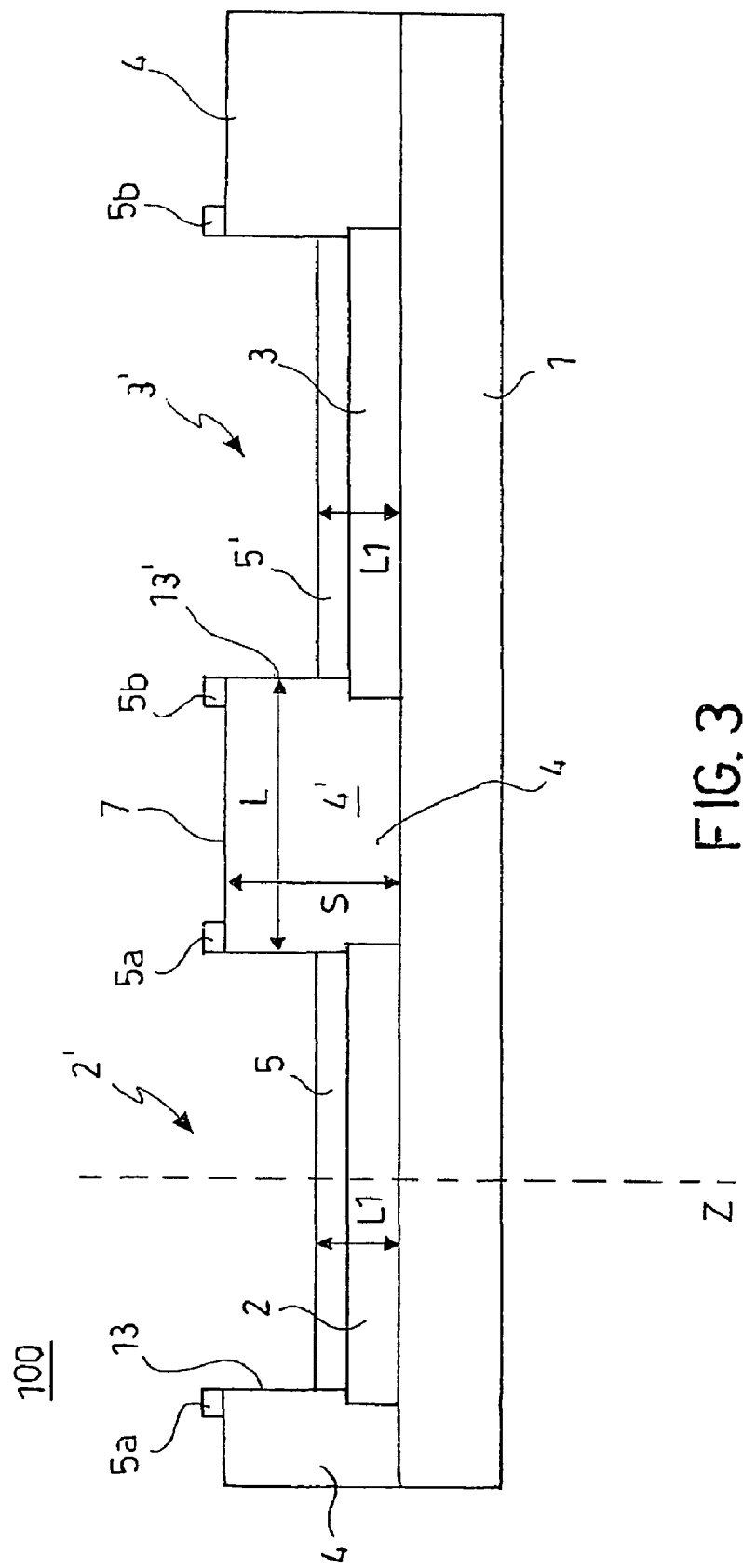

The following discussion is presented to enable a person skilled in the art to make and use the embodiments described in the present disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

With reference to FIGS. 1 to 5, an example of a process for manufacturing an electroluminescent device 100 including one or more radiation emitter devices made of organic materials, such as Organic Light Emitting Diodes (OLEDs) is now described according to one embodiment.

The electroluminescent device 100 can be, for example, a light display including a plurality of radiation emitter devices, which are preferably arranged such as to provide a dot- or pixel-matrix. For clarity's sake, reference will be made in the present description and figures to two radiation emitter devices only.

As illustrated in FIG. 1, on a common support substrate 1, first 2 and second 3 electrodes are defined side by side to each other, and suitable to receive respective excitation signals. Both electrodes are defined through a conventional photolithography process from a layer of electrically conductive material, such as metal, doped poly-silicon, polymer or Indium Tin Oxide (ITO). This layer may be deposited on the support substrate 1 using one of the conventional techniques below: Joule effect thermal evaporation deposition, E-beam evaporation deposition, deposition by ablation of a target induced by an ion beam (i.e. sputtering).

To the deposition, a definition step is associated (which is required to give a preset geometry or pattern) of the first 2 and second 3 electrodes, which can be carried out using various alternative techniques. For example, conventional photolithography techniques can be used, which provide, as is known to those skilled in the art, using an auxiliary mask made of photosensitive material, preferably photoresist. Alternatively, a so-called "shadow mask" can be used for defining the geometries of the electrodes, which is interposed between the substrate and the source of the material to be deposited. It should be considered, however, that this type of mask can cause depositions that are not perfectly aligned, as already said above (crosstalk). Each of the electrodes 2 and 3 acts as a hole injector or anode of the single light radiation emitter device.

It should be observed that the selection of which technique should be employed for defining the electrodes 2 and 3 can depend, for example, on the resolution desired. Conventional photolithography techniques allow reaching a resolution lower than one micron. A technique of thermal evaporation through a shadow mask, instead, can reach values of several microns, such as 5 to 10 microns.

The support substrate 1 is typically of a material consistent with the processes used for manufacturing the device, for example it can be made of silicon or also alternative and cheaper materials such as glass, for example flat glass, borosilicates, aluminosilicates or others and plastics, for example PolyethyleneTerephthalate (PET) oppure Polyethersulfone (PES).

A layer of dielectric material 4 is then deposited on the structure of FIG. 1 by using, for example, any conventional technique for the deposition of a dielectric material. For example, the sputtering technique or the Plasma-activated Chemical Vapor Deposition (PCVD). A useful dielectric material is silicon dioxide, though alternatively, silicon nitride can as well be used. According to the example in question, the layer of dielectric material 4 has a base surface in contact with the support substrate 1.

At this point, for example, a cavity (called the "via hole" in the technique) is defined on the layer of dielectric material 4 by a conventional photolithography process at each electrode that has been previously defined. In the case such as described and shown in FIG. 2, at the first electrode 2 there is defined a first cavity 2' and at the second electrode 3 there is defined a second cavity 3'. As may be seen in FIG. 2, each of the cavities 2' and 3' is defined by a respective inner (for example, vertical) wall 13 and 13' that is etched within the dielectric layer 4. Furthermore, the dielectric layer 4 is etched such as it partially overlaps a peripheral portion of each electrode 2 and 3. This measure, which is particularly advantageous, is adopted to avoid that trenches (i.e. gaps) are formed between each electrode 2 and 3 and the dielectric material 4. Furthermore, the layer of dielectric material 4 has a partition wall 4' interposed between the cavities 2' and 3'. The layer of dielectric material 4 or, at least the partition wall 4', has a suitable thickness S that is evaluated along an axis z (orthogonal to substrate 1) and identifies an upper face 7.

Subsequently in FIG. 3, a deposition step of a first layer of organic material (preferably of low molecular weight) is carried out, which results in the formation of a first active layer 5 within the first cavity 2', which overlaps the first electrode (anode) 2, and in the formation of a second active layer 5' within the second cavity 3', which overlaps the second electrode (anode) 3.

A low molecular weight organic material (also known as oligomer) is used for forming these active layers 5 and 5' according to one embodiment. For example, the first and second active layers 5 and 5' have such a mobility of the charge carriers (electrons and holes) to play the role of a HTL. A suitable material for providing the active layers 5 and 5' is N,N'-diphenyl-N,N'-bis(3-methylphenyl)1-1'biphenyl-4, 4'diamine (TPD), a material belonging to the diamines.

For example, the active layers 5 and 5' are deposited by means of a conventional technique of thermal evaporation (for example, by Joule effect) through shadow mask. It should be noted that the e-beam evaporation technique, when used for providing this organic layer, may cause an instant damage to the material and not the evaporation of the same, since the organic materials are very delicate.

Upon deposition of the active layers 5 and 5' by means of a shadow mask, a first peripheral portion of organic material 5a and a second peripheral portion of organic material 5b are also formed over a face of the dielectric layer 4 opposing the substrate 1. These peripheral portions are due to the fact that, in order to avoid the formation of trenches between the inner walls 13 and 13' and the layers 5 and 5', a shadow mask is preferably used which identifies apertures of a greater size than the cavities 2' and 3'.

It is important to observe that the partition wall 4' has the thickness S such that the upper face thereof 7 is at a higher level (measured relative to the substrate 1) than the height L1 reached by the active layers 5 and 5' relative to the substrate 1. This has the advantage that the peripheral portions 5a and 5b are not in contact with the active layers following the deposition of the active layers 5 and 5'.

Figure 4:
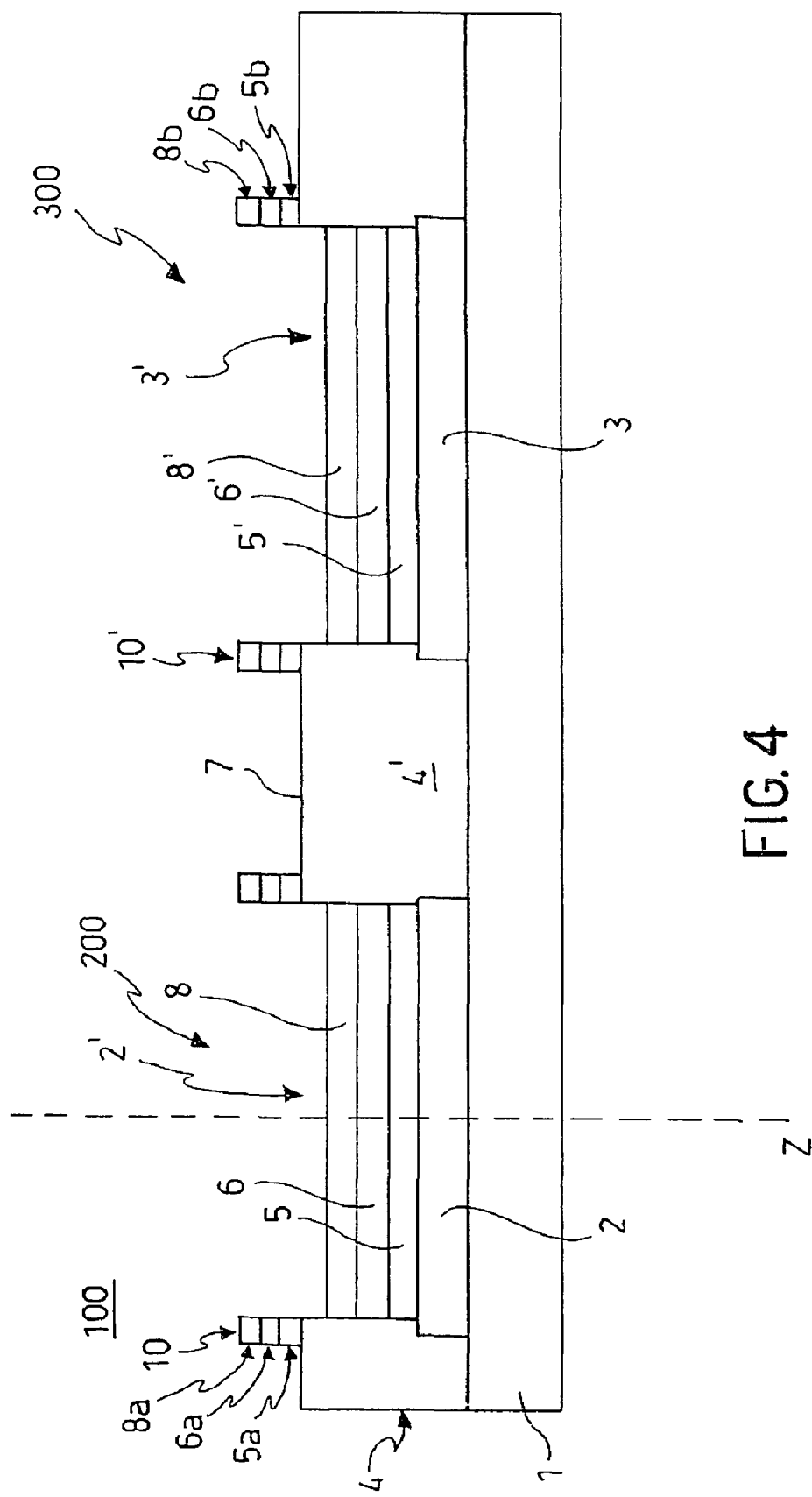

With reference to FIG. 4, according to the example described, there are formed a third active layer 6 overlapping the first active layer 5 and arranged within the first cavity 2', and a fourth active layer 6' overlapping the second active layer 5' and arranged within the second cavity 3'. The active layers 6 and 6' are of an organic material (for example, of a low molecular weight) and have such a mobility of the charge carriers (electrons and holes) to function as ETL. A suitable material for providing these active layers 6 and 6' is tris-(8-hydroxyquinoline)aluminum ($Alq_3$).

A step of forming a third electrode 8 is then carried out, which is placed inside the first cavity 2' and overlapping the third active layer 6, and a fourth electrode 8' which is placed inside the second cavity 2' and overlapping the fourth active layer 6'. The electrodes 8 and 8' are provided by the deposition of an electrically conductive material, such as a metal (for example, aluminum).

To prevent the underlying polymer layers from being damaged, those photolithography techniques of deposition and geometry definition of the electrodes 8 and 8' that are commonly used for silicon and metal are not adopted. Accordingly, the use of a technique of shadow mask evaporation deposition (Joule effect) is also convenient for the electrodes 8 and 8'.

The third 8 and fourth 8' electrodes are electron injectors or cathodes.

In the deposition of the active layers (ETL) 6 and 6' and electrodes (cathodes) 8 and 8' corresponding portions (6a, 6b and 8a and 8b) of (organic and metal, respectively) material are formed, which are stacked to portions 5a and 5b. The portions 5a, 6a and 8a form first relief 10 and the portions 5b, 6b and 8b form a second relief 10'. The thickness S of the partition wall 4' is high enough to avoid that the active layers 6 and 6' (ETL) may directly contact each other while being deposited. This measure, for example, can also be taken to avoid any direct contact between both cathodes 8 and 8'.

Using the same shadow mask for each of the layers (5, 5', 6, 6', 8 and 8') allows obtaining a multi-layered structure with the outer side wall being substantially vertical. As stated above, the shadow mask has apertures of a greater size than the size of the apertures 2' and 3' previously obtained within the layer of dielectric material.

Arranging a shadow mask with apertures of greater size than the apertures 2' and 3' allows avoiding the possibility that trenches may be formed between the multi-layered structure and the layer of dielectric material enclosing the apertures 2' and 3'.

A typical value for the thickness of the layer of dielectric material 4 is, for example, 1 μm.

Figure 5:
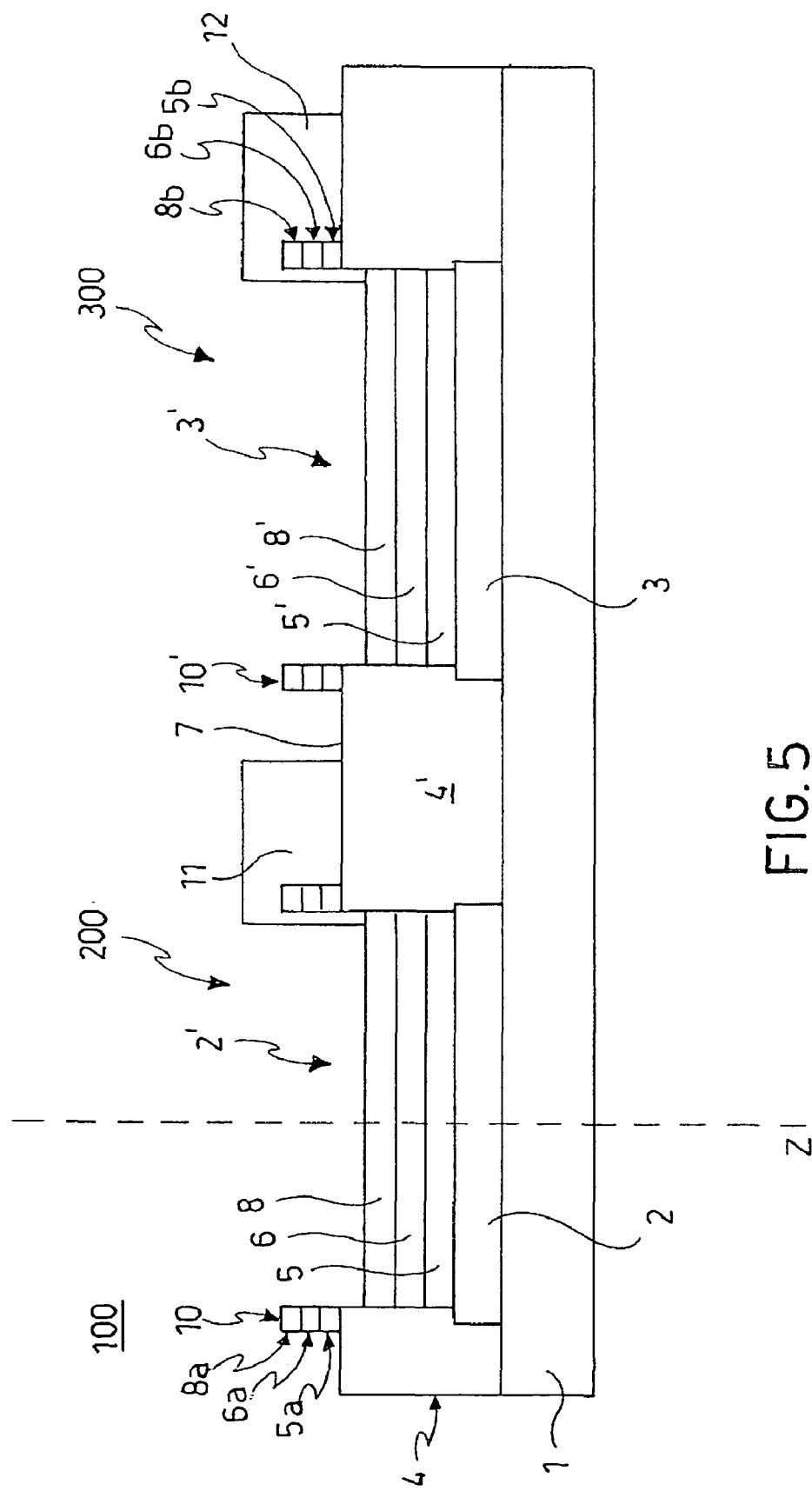
FIG. 5 is a longitudinal sectional view of an electroluminescent device comprising at least two OLED devices according to one embodiment.
Figure 6:
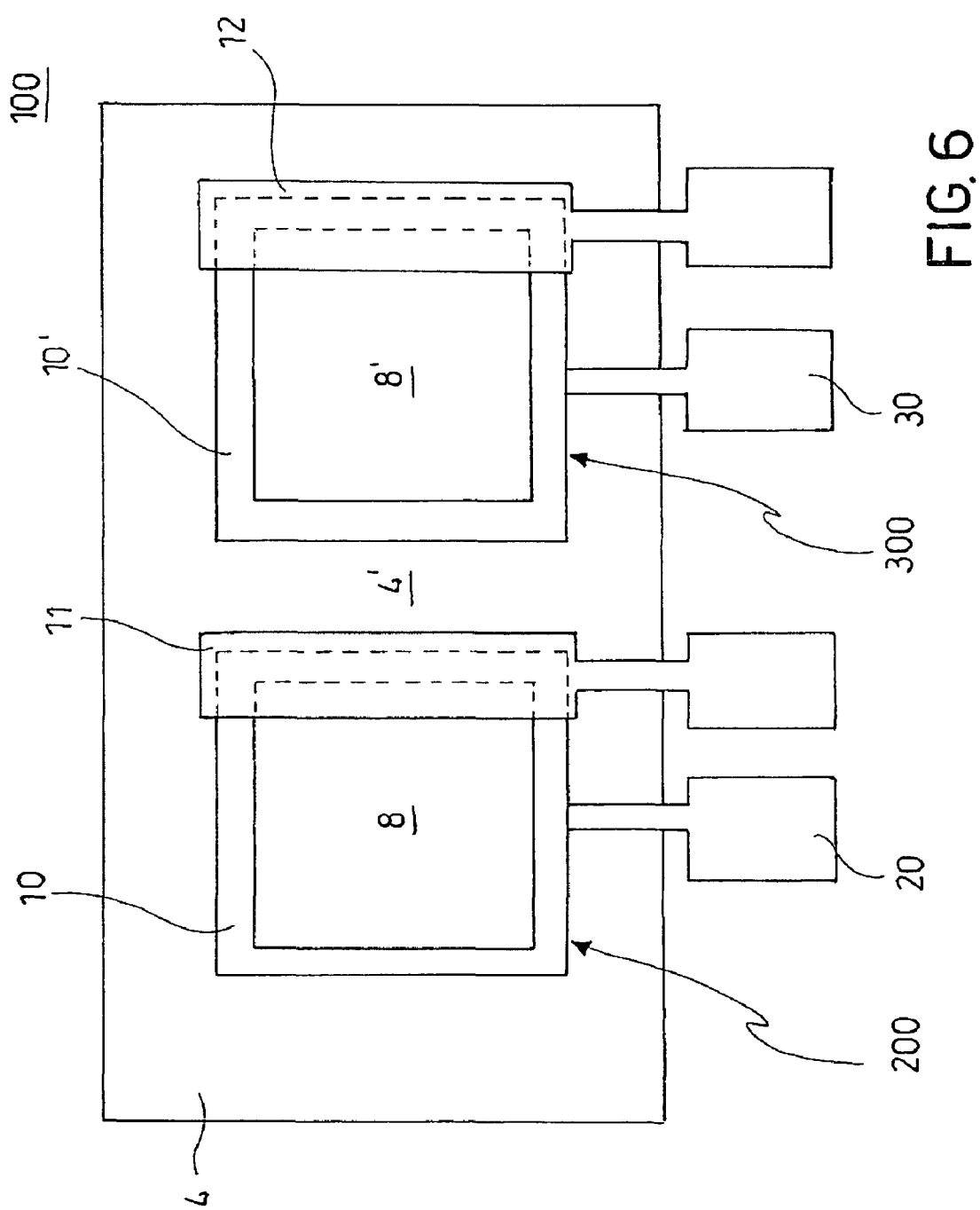
FIG. 6 is a plan view of the device from FIG. 5.

At this point, such as illustrated in FIGS. 5 and 6, by a Joule effect evaporation deposition technique through shadow mask, first 11 and second 12 electric contacts or pads are deposited and defined, which are made of conductive material, preferably metal. The first contact 11, which functions as the cathode contact, extends over a part of the relief 10 and contacts a portion of the third electrode 8. The second contact 12, which functions as the cathode contact, extends over a part of the relief 10' and contacts a portion of the fourth electrode 8'.

Both the first 11 and the second contact 12 longitudinally extend outwardly of the device 100, for allowing the application of an excitation electric signal (such as a current or electric voltage).

A third 20 and fourth 30 contacts are simply extensions of the contact 2 and contact 3, respectively.

The first 2 and the third 8 electrodes being counter-posed to each other and including the first 5 and third 6 active layers, correspond to a first radiation emitter device (an OLED) that is fabricated at the aperture 2' and designated in FIG. 4 with numeral 200. The second 3 and fourth 8' electrodes being counter-posed to each other and including the second 5' and fourth 6' active layers, correspond to a second radiation emitter device (a OLED) that is fabricated at the aperture 3' and designated in FIG. 4 with numeral 300.

With the first emitter device 200 the excitation electric signal can be applied by means of the two electric contacts 11 and 20 whereas with the second emitter device 300 the corresponding excitation electric signal can be applied by means of the electric contacts 12 and 30.

By providing the excitation electric signal to one of the emitter devices 200 and 300, that device is turned on and light is emitted which is of a color belonging to the group of basic colors (R, G, B). The type of color depends on the emission wavelength that, as is known to those skilled in the art, is affected by the quantum-energy characteristics of the materials being used, for example Alq3 has green emissions at 535 nm. For applications in the display field, these electroluminescent devices typically emit radiation in the visible range.

As may be seen also in the section of FIG. 5, the layer of insulating material 4 has a partition wall 4' interposed between the inner region of the first emitter device 200 (i.e. that region including the active layers 5 and 6 being arranged between the electrodes 2 and 8) and the inner region of the second emitter device 300, that includes the active layers 5' and 6' being arranged between the electrodes 3 and 8'. Particularly, the partition wall 4' separates the first 5 and third 6 active layers from the second 5' and fourth 6' active layers.

It should be observed that this partition wall 4' of dielectric material electrically isolates the inner region of the first emitter device 200 from the inner region of the second emitter device 300. This substantially avoids that an electric current associated with the excitation signal provided to only one of the emitter devices may reach the other emitter device and interacts with the excitation current, the electrodes or directly the active layers of the latter. Therefore, the partition wall 4' of the dielectric layer 4 or another isolation means of dielectric material (such as for example, a portion of dielectric material having a different geometry than that illustrated) allows avoiding the effect of electrical crosstalk.

In addition, the partition wall 4' has some advantages also during the manufacturing step of the electroluminescent device 100. In fact, during each step of shadow mask evaporation deposition of the active layers 5-5' (see FIG. 3) and 6-6', the partition wall 4' is a barrier preventing that the layers of organic material 5 and 5' may be laterally diffused, which would cause the same to directly contact each other, with the likely consequence that a problem of electrical and optical crosstalk may occur. In addition, even though the peripheral portions 5a and 5b (or 6a and 6b, or 8a and 8b) deposit on the partition wall 4' such as to be in contact to each other, they would not directly contact, however, either the respective active layers 5 and 5', 6 and 6' or the electrodes 8 and 8' within the respective cavities 2' and 3', thereby avoiding the consequent crosstalk between the devices 200 and 300.

The emitter devices 200 and 300 can be, according to the type and thickness of the materials used for the contacts and the substrate 1, of the top emitting (upward emission) or bottom emitting (downward emission, i.e. through the substrate) types.

In greater detail, considering the reference axis z, orthogonal to the support substrate 1 and shown in FIG. 4, the top emitting solution provides that the emitter device 200 has the third electrode 8 transparent to the light radiation generated by the first 5 and third 6 active layers, such that the radiation is emitted outwardly through this electrode 8 and substantially parallel to axis z. In this case, the first electrode 2 is instead reflective to the same radiation.

If the emitter device 200 is desired to emit light downwards (bottom emitting mode) both the first electrode 2 (anode), and the support substrate 1 will be transparent, whereas the third electrode 8 will be reflective.

According to an alternative embodiment, with downward light emission, the first electric contact 11 can be omitted if the third electric contact 8 is deposited which has such a thickness to extend until the respective cavity 2' is filled and the stack of peripheral portions 5a and 6a is covered.

To ensure the transparency required for the electrodes, other materials can also be used alternatively to metals, which are known for their transparency and at the same time having conductivity characteristics similar to those of metals. This is necessary when such a transparency is required that cannot be ensured by metal layers having the thickness values stated above. One of these materials, for example, is Indium Tin Oxide (ITO).

It should be noted that, according to current knowledge, ITO can be deposited either with the sputtering or e-beam techniques; usually, these techniques are not, however, employed for depositing the third electrode 8 over the layers of organic material 5, 5' and 6, 6' that may deteriorate. For this reason, only the first 2 and second 3 electrodes are typically made of ITO.

Furthermore, it should be observed that the partition wall 4' (or the whole dielectric layer 4) can be, advantageously, made of a material that is not only dielectric but also non-transparent (such as polyimide) and thus have a shield to the light thereby preventing the same to propagate sideways from an emitter device to the adjacent one (problem of the optical crosstalk).

According to the various embodiments described above, two active layers of low molecular weight organic material (ETL and HTL) have been employed for each emitter device 200 and 300. However, the teachings of embodiments may as well be applied to emitter devices (OLED) comprising any number of organic active layers, such as one to ten layers. This number depends on various design and operating aspects as is known to those skilled in the art. Among the main aspects affecting the number of active layers, there is the emission wavelength, efficacy and turning-on voltage of individual OLEDs.

Alternatively to low molecular weight organic materials, embodiments are also practicable using high molecular weight organic materials (polymers). In this case, each emitter device can also comprise an individual active layer. In fact, the properties of a high molecular weight polymer material are such that it can have the double function of hole (HTL) and electron (ETL) transporter. The deposition techniques for the high molecular weight materials are, for example, spin-coating deposition (an initial layer of great uncontrolled thickness is made thin by quickly rotating the substrate) or localized deposition of micro droplets (inkjet printing) of width ranging, for example, from 30 and 50 microns.

As may be understood from the description above, both the manufacturing process and the electroluminescent device in accordance with embodiments, are advantageous since they reduce electric crosstalk using dielectric material. It should be also noted that the partition wall of dielectric material 4' allows one to reduce or eliminate this crosstalk, without reducing the resolution of the whole electroluminescent device, because it does not require any increase in the distance between the individual OLEDs, unlike the conventional techniques.

When the device 200 (300) is top emitting, several design values, which are merely exemplary, are as follows according to embodiments:
  glass substrate 1;
  first electrode 2 (second electrode 3) of gold, with at least 1500 Å thickness,
  first active layer 5 (second active layer 5') of TPD, with 750 Å thickness,
  third active layer 6 (fourth active layer 6') of Alq3, with 550 Å thickness,
  third electrode 8 (fourth electrode 8') of aluminum, 10-20 Å thickness, to be transparent,
  thickness S of the partition wall 4' of 1 μm,
  thickness of the first contact 11 and second contact 12 (such as to contact the third 8 and fourth 8' electrodes, respectively) of 1 μm.

The thickness values are evaluated along the axis z.

When the device 200 (300) is bottom emitting, several design values, which are merely exemplary, are:
  glass substrate 1;
  first electrode 2 (second electrode 3) of ITO, with 1600 Å thickness,
  first active layer 5 (second active layer 5') of TPD, with 750 Å thickness,
  third active layer 6 (fourth active layer 6') of Alq$_3$, with 550 Å thickness,
  third electrode 8 (fourth electrode 8') of aluminum, 1600 Å thickness,
  thickness of the first contact 11 and second contact 12 (such as to contact the third 8 and fourth 8' electrodes, respectively) of 1 μm,
  thickness S of the partition wall 4' of 1 μm.

It should be noted that the thickness of the third electrode 8 is less important than the other thickness values, because it is typically made of metal, thereby ensuring a reflectivity at each thickness value, except with a thickness of a few Å.

Generally, the thickness S can range from 0.5 and 1.5 μm, and preferably ranges from 0.8 and 1.2 μm.

Generally, the maximum length L of the partition wall 4' (as measured parallel to the substrate 1) depends on the type of application for which the display is intended, with a minimum of 1-2 µm for top emitting ultra high resolution displays.

From the foregoing it will be appreciated that, although specific embodiments have been described herein for purposes of illustration, various modifications may be made without deviating from the spirit and scope of the disclosure.

The invention claimed is:

1. An electroluminescent device, comprising:
    at least first and second radiation emitter devices arranged on a common substrate, the first and second radiation emitter devices including a first active layer and a second active layer of organic material for generating radiation, respectively;
        wherein the first radiation emitter device includes a first electrode over which the first active layer is formed and the second radiation emitter device includes a second electrode over which the second active layer is formed;
        wherein the first radiation emitter device includes a third electrode formed over the first active layer and the second radiation emitter device includes a fourth electrode formed over the second active layer;
    isolation means of dielectric material being interposed between the first active layer, first electrode, and third electrode and the second active layer, second electrode, and fourth electrode to electrically isolate the first active layer and the first and third electrodes from the second active layer and the second and fourth electrodes; and
    wherein the isolation means include a layer of dielectric material such as to define first and second cavities associated with the first and second radiation emitter devices, respectively, the layer of dielectric material including a partition wall of the cavities having,
        a vertical portion in contact with side surfaces of the first active layer and the first and third electrodes and side surfaces of the second active layer and the second and fourth electrodes;
        an overlapping portion that overlaps a peripheral portion of each of the first and second electrodes; and
        wherein the partition wall has a greater thickness than a height of the first electrode, first active layer, and third electrode and a height of the second electrode, second active layer, and fourth electrode, and wherein the thickness and the height are measured from the surface of the support substrate according to a radiation emission major axis.

2. The device according to claim 1, wherein said dielectric material comprises silicon dioxide.

3. The device according to claim 1, wherein said dielectric material comprises silicon nitride.

4. The device according to claim 1, wherein said first and second active layers are N,N'-diphenyl-N,N'-bis(3-methylphenyl)1-1'biphenyl-4,4'diamine.

5. The device according to claim 1, wherein said partition wall has a maximum width ranging from 1 to 2 µm.

6. The device according to claim 1, wherein the third electrode is counter-posed to the first electrode and the fourth electrode is counter-posed to the second electrode, respectively, and wherein the third and fourth electrodes are arranged in contact with the first and second active layer, respectively.

7. The device according to claim 6, wherein the first and second devices comprise a first electric contact suitable for electrical contact with the third electrode and a second electrical contact suitable for electrical contact with the fourth electrode, respectively, the first and second electric contacts allowing the application of respective excitation electric signals.

8. The device according to claim 1, wherein the first and second radiation emitter devices comprise a third active layer arranged in contact with the first active layer and a fourth active layer arranged in contact with the second active layer, respectively.

9. The device according to claim 1, wherein the first and second active layers have the double function of hole transporter and electron transporter.

10. The device according to claim 8, wherein the first and second active layers have the function of hole transporters, and the third active layer and the fourth active layers have the function of electron transporters.

11. The device according to claim 1, wherein the support substrate is made of a material selected from silicon, silicon dioxide and plastic material.

12. The device according to claim 6, wherein the support substrate and the first and second electrodes have such a thickness to be transparent to light radiation, whereas the third and fourth electrodes have such a thickness to be reflective to such light radiation.

13. The device according to claim 6, wherein the support substrate and the first and second electrodes have such a thickness as to be reflective to light radiation whereas the third and fourth electrodes have such a thickness to be transparent to the light radiation.

14. The device according to claim 12, wherein the first and second electrodes are made of an electrically conductive material and are transparent to radiation.

15. The device according to claim 14, wherein the first and second electrodes are made of indium tin oxide, ITO.

16. The device according to claim 1, wherein an excitation electric signal is a potential difference.

17. The device according to claim 1, wherein each of the first and second active layers has such characteristics allowing a light radiation to be emitted in the visible range for application in the display field.

18. The device according to claim 12, wherein the third and fourth electrodes are made of metal material.

19. The device according to claim 2, wherein the isolation means made of silicon dioxide have such a refractive index to allow the propagation of interference radiation associated with losses of the first emitter device such that the interference with the second emitter device is reduced.

20. The device according to claim 1, further comprising a plurality of further radiation emitter devices being arranged on the common substrate according to a matrix arrangement.

21. An electroluminescent device, comprising:
    a substrate having an approximately planar surface;
    a first radiation emitter device formed on the substrate, the first radiation emitter device including,
        a first electrode formed on the approximately planar surface of the substrate, the first electrode having,
            an outer side wall having a surface that is approximately orthogonal to the approximately planar surface of the substrate, and
            a peripheral portion having a surface that is approximately parallel to the approximately planar surface of the substrate;
        a first active layer formed on the first electrode, the first active layer having an outer side wall; and
        a second electrode formed over the first active layer, the second electrode and having an outer side wall;
    a second radiation emitter device formed on the substrate, the second radiation emitter device including, a third electrode formed on the approximately planar surface of the substrate, the third electrode having,
an outer side wall having a surface that is approximately orthogonal to the approximately planar surface of the substrate, and
a peripheral portion having a surface that is approximately parallel to the approximately planar surface of the substrate;
a second active layer formed on the third electrode, the second active layer having an outer side wall; and
a fourth electrode formed over the second active layer, the fourth electrode having an outer side wall; and
an isolation region formed between the first and second radiation emitter devices, the isolation region having,
substantially vertical side walls adjoining the outer side walls of the first and second active layers and the outer side walls of the first, second, third, and fourth electrodes;
overlapping side wall portions adjoining the peripheral portions of the first and third electrodes; and
wherein the isolation region has a greater thickness than a thickness of the first electrode, first active layer, and second electrode and a thickness of the third electrode, second active layer, and fourth electrode, wherein the thicknesses are measured from the surface of the substrate along a radiation emission major axis.

22. An electroluminescent device, comprising:
a substrate having a surface;
a first radiation emitter device formed over the substrate, the first radiation emitter device including a first active layer;
a second radiation emitter device formed over the substrate, the second radiation emitter device including a second active layer;
wherein the first radiation emitter device includes a first electrode formed over the substrate, with the first active layer being formed over the first electrode and a second electrode formed over the first active layer;
wherein the second radiation emitter device includes a third electrode formed over the substrate, with the second active layer being formed over the third electrode and a fourth electrode formed over the second active layer;
an isolation region formed over the substrate between the first and second radiation emitter devices and having first and second spaced-apart side walls, each of the first and second spaced-apart side walls including vertical portions having surfaces substantially orthogonal to the surface of the substrate and having a horizontal portion having a surface substantially parallel to the surface of the substrate, the isolation region electrically isolating the first active layer, first electrode, and second electrode of the first radiation emitter device from the second active layer, third electrode, and fourth electrode of the second radiation emitter device;
wherein side walls of the first active layer, first electrode, and second electrode of the first radiation emitter device abut the vertical portions of the first spaced-apart side wall of the isolation region;
wherein side walls of the second active layer, third electrode, and fourth electrode of the second radiation emitter device abut the vertical portions of the second spaced-apart side wall of the isolation region;
wherein the horizontal portions of the first and second spaced-apart side walls abut end portions of horizontal surfaces of the first and third electrodes, respectively, the horizontal surfaces of the first and third electrodes being substantially parallel to the surface of the substrate, and
wherein the isolation region has a thickness extending from the substrate that is greater than a thickness of the first electrode, first active layer, and second electrode of the first radiation emitter device and greater than a thickness of the third electrode, second active layer, and fourth electrode of the second radiation emitter device.

23. A light-emitting device, comprising:
a substrate having an approximately planar surface;
a first radiation emitter device including a first electrode layer formed over the substrate, a first active layer formed over the first electrode layer, and a second electrode layer formed over the first active layer, each of these layers including side walls and the first electrode layer further including an end portion;
a second radiation emitter device including a third electrode layer formed over the substrate, a second active layer formed over the third electrode layer, and a fourth electrode layer formed over the second active layer, each of these layers including side walls and the third electrode layer further including an end portion; and
an isolation region formed over the approximately planar surface of the substrate, the isolation region including,
a first outer portion having a first side wall,
a second outer portion having second side wall, and
a partition portion formed between the first and second outer portions,
the partition portion having a first side wall that forms a first cavity with the first side wall of the first outer portion and the substrate, the first radiation emitter device being formed in the first cavity with the first side walls of each of the partition portion and the first outer portion including portions that extend over the end portions of the first electrode layer and portions that adjoin the side wall portions of the first and second electrode layers;
the partition portion having a second side wall that forms a second cavity with the second side wall of the second outer portion and the substrate, the second radiation emitter device being formed in the second cavity with the second side walls of each of the partition portion and the second outer portion including portions that extend over the end portions of the third electrode layer and portions that adjoin the side wall portions of the third and fourth electrode layers; and
wherein each of the first outer portion, second outer portion, and partition portion has a thickness extending from the substrate that is greater than a thickness of the first electrode, first active layer, and second electrode of the first radiation emitter device and greater than a thickness of the third electrode, second active layer, and fourth electrode of the second radiation emitter device.

* * * * *